United States Patent
Balteanu et al.

(10) Patent No.: US 7,496,339 B2
(45) Date of Patent: Feb. 24, 2009

(54) AMPLITUDE CALIBRATION ELEMENT FOR AN ENHANCED DATA RATES FOR GSM EVOLUTION (EDGE) POLAR LOOP TRANSMITTER

(75) Inventors: Florinel G. Balteanu, Ottawa (CA); Ionel Gheorghe, Ottawa (CA); Rajasekhar Pullela, Colton, CA (US); Tirdad Sowlati, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 400 days.

(21) Appl. No.: 11/125,673

(22) Filed: May 10, 2005

(65) Prior Publication Data

US 2006/0258306 A1  Nov. 16, 2006

(51) Int. Cl.
*H04B 1/06* (2006.01)

(52) U.S. Cl. .............. 455/260; 455/108; 455/110; 455/127.1; 455/240.1

(58) Field of Classification Search ............ 455/126, 455/127.2, 3, 115.1–115.3, 522, 108, 110, 455/127.1, 214, 234.1, 240.1, 250.1, 256–260; 330/278, 285, 291, 296–298; 375/297

See application file for complete search history.

(56) References Cited

U.S. PATENT DOCUMENTS

| | | | |
|---|---|---|---|
| 5,420,550 A * | 5/1995 | May ..................... | 331/143 |
| 5,606,285 A * | 2/1997 | Wang et al. ............ | 330/134 |
| 5,684,832 A | 11/1997 | Adachi et al. | |
| 6,466,070 B1 * | 10/2002 | Ross ..................... | 327/157 |
| 6,586,964 B1 | 7/2003 | Kent et al. | |
| 6,950,636 B2 * | 9/2005 | Rozenblit et al. ....... | 455/126 |
| 2002/0176188 A1 * | 11/2002 | Ruegg et al. ........... | 360/46 |

OTHER PUBLICATIONS

Tirdad Sowlati et al., Quad-Band GSM/GPRS/EDGE Polar Loop Transmitter, IEEE Journal of Solid State Circuits, vol. 39, No. 12, Dec. 2004, pp. 2179-2189.

* cited by examiner

*Primary Examiner*—Nhan T Le (57) ABSTRACT

An amplitude calibration element comprises a linear driver configured to receive the output of a modulator, the modulator output comprising a voltage signal having an amplitude modulated (AM) portion, a differential detector configured to receive an output of the linear driver and develop a differential signal corresponding to the AM portion, and a differential comparator configured to receive the output of the differential detector and a differential reference signal, the differential comparator configured to develop a gain control signal to control the gain of the linear driver.

18 Claims, 8 Drawing Sheets

AMPLITUDE CALIBRATION ELEMENT FOR AN ENHANCED DATA RATES FOR GSM EVOLUTION (EDGE) POLAR LOOP TRANSMITTER

BACKGROUND OF THE INVENTION

1. Field of the Invention

This invention relates generally to power amplifier control. More particularly, the invention relates to an amplitude calibration element for enhanced data rates for a GSM evolution (EDGE) polar loop transmitter.

2. Related Art

With the increasing availability of efficient, low cost electronic modules, portable communication devices are becoming more and more widespread. A portable communication device includes one or more power amplifiers for amplifying the power of the signal to be transmitted from the portable communication device.

With the decreasing size of portable communication devices, power efficiency is one of the most important design criteria. Reducing power consumption prolongs power source life and extends stand-by and talk time of the portable communication device. In a portable communication device that uses a non-constant amplitude output (i.e., one that modulates and amplifies both a phase component and an amplitude component), a linear power amplifier is typically used.

Unfortunately, a linear power amplifier has lower power efficiency than a nonlinear power amplifier and therefore increases the overall power consumption of the portable communication device. However, a non linear power amplifier can be used by employing separate feedback control of the amplitude modulation (AM) and phase modulation (PM) portions of the output signal. Using separate AM and PM feedback loops significantly reduces the problems with AM-to-PM conversion and AM-to-AM conversion when using a non-linear power amplifier. Such an architecture is referred to as a "polar loop" transmitter and uses separate feedback paths to control the amplitude and phase modulation. Further, the polar loop architecture allows for a large dynamic output power control range, which is desirable for the transmitter to operate in the Global System for Mobile Communication (GSM) standard.

One of the requirements for introducing the amplitude modulation into a power control feedback loop of a non-linear power amplifier is accurately detecting and calibrating the AM portion of the transmit signal so that it properly modulates and controls the power of the output signal. In the past, a diode detector has been used to detect and calibrate the AM portion of the signal. Unfortunately, a diode detector suffers from inaccuracy from temperature and manufacturing process variations, which must be compensated.

Therefore, it would be desirable to accurately calibrate the AM portion of the transmit signal without the need to compensate for variations in a diode detector.

SUMMARY

Embodiments of the invention include an amplitude calibration element comprising a linear driver configured to receive the output of a modulator, the modulator output comprising a voltage signal having an amplitude modulated (AM) portion, a differential detector configured to receive an output of the linear driver and develop a differential signal corresponding to the AM portion, and a differential comparator configured to receive the output of the differential detector and a differential reference signal, the differential comparator configured to develop a gain control signal to control the gain of the linear driver.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the amplitude calibration element can be implemented in any communication device employing separate AM and PM closed feedback power control paths.

The amplitude calibration element can be implemented in hardware, software, or a combination of hardware and software. When implemented in hardware, the amplitude calibration element can be implemented using specialized hardware elements and logic. When the amplitude calibration element is implemented partially in software, the software portion can be used to control components in the amplitude calibration element so that various operating aspects can be software-controlled. The software can be stored in a memory and executed by a suitable instruction execution system (microprocessor). The hardware implementation of the amplitude calibration element can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the amplitude calibration element comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via, for instance, optical scanning of the paper or other medium, then compiled, interpreted or otherwise processed in a suitable manner if necessary, and then stored in a computer memory.

Figure 1:
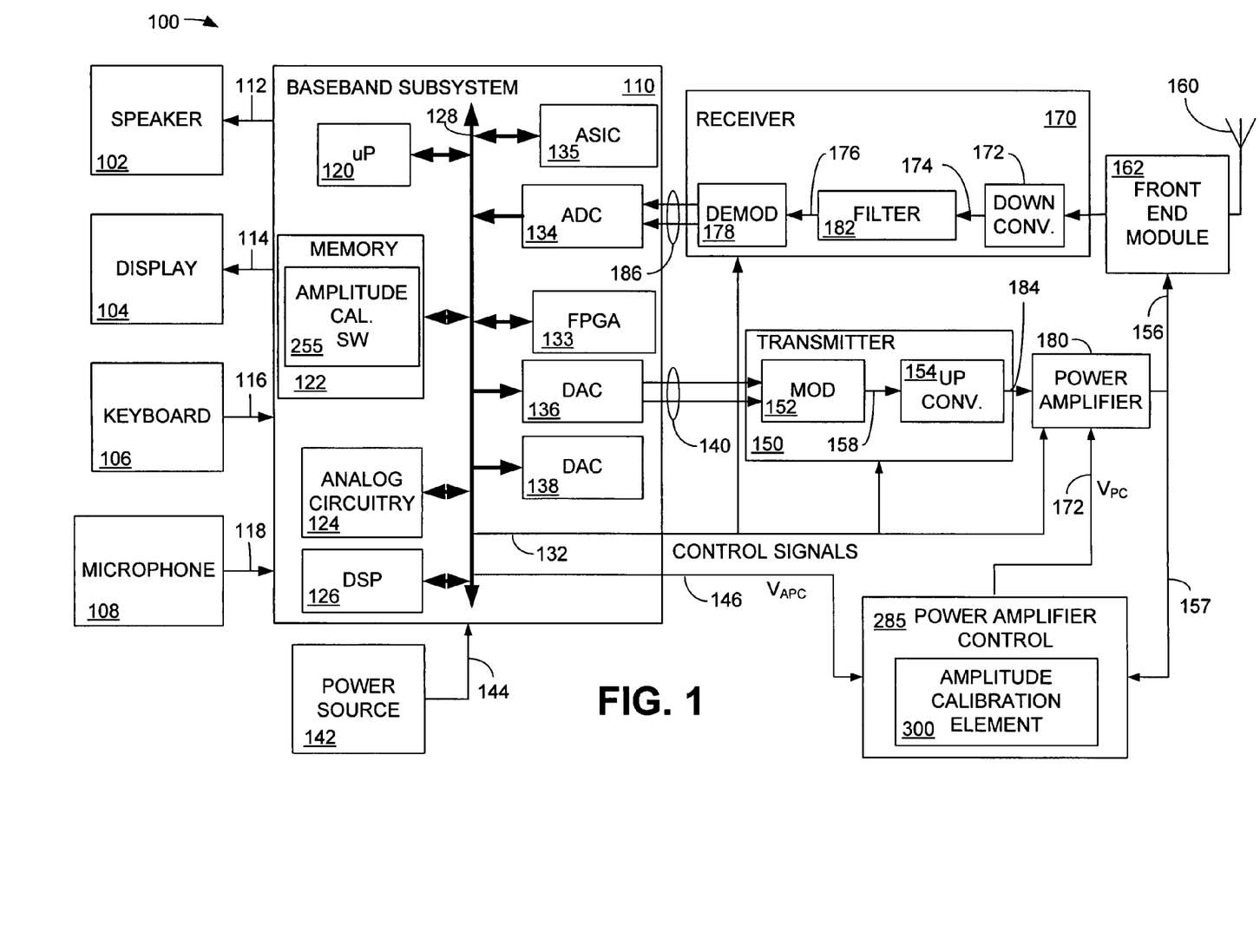
FIG. 1 is a block diagram illustrating a simplified portable transceiver including an embodiment of an amplitude calibration element.

FIG. 1 is a block diagram illustrating a simplified portable transceiver 100 including an embodiment of an amplitude calibration element.

The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the amplitude calibration element is implemented, the baseband subsystem 110 may also include an application specific integrated circuit (ASIC) 135 and/or a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150, receiver 170, power amplifier 180 and the power amplifier control element 285 via connection 132.

The baseband subsystem 110 generates a power control signal, referred to as $V_{APC}$, which is supplied to the power amplifier control element 285 via connection 146. The signal $V_{APC}$ is generated by the baseband subsystem 110 and is generally converted to an analog control signal by one of the digital-to-analog converters (DACs) 136 or 138 to be described below. The power control signal $V_{APC}$ is illustrated as being supplied from the bus 128 to indicate that the signal may be generated in different ways as known to those skilled in the art. Generally, the power control signal, $V_{APC}$, controls the power amplifier as a function of the peak voltage of the power amplifier determined during calibration, and corresponds to power amplifier output power.

The control signals on connections 132 and 146 may originate from the DSP 126, the ASIC 135, the FPGA 133, or from microprocessor 120, and are supplied to a variety of connections within the transmitter 150, receiver 170, power amplifier 180, and the power amplifier control element 285. It should be noted that, for simplicity, only the basic components of the portable transceiver 100 are illustrated herein. The control signals provided by the baseband subsystem 110 control the various components within the portable transceiver 100. Further, the function of the transmitter 150 and the receiver 170 may be integrated into a transceiver.

If portions of the amplitude calibration element are implemented in software that is executed by the microprocessor 120, the memory 122 will also include amplitude calibration software 255. The amplitude calibration software 255 comprises one or more executable code segments that can be stored in the memory and executed in the microprocessor 120. Alternatively, the functionality of the amplitude calibration software 255 can be coded into the ASIC 135 or can be executed by the FPGA 133, or another device. Because the memory 122 can be rewritable and because the FPGA 133 is reprogrammable, updates to the amplitude calibration software 255 can be remotely sent to and saved in the portable transceiver 100 when implemented using either of these methodologies.

Baseband subsystem 110 also includes analog-to-digital converter (ADC) 134 and digital-to-analog converters (DACs) 136 and 138. Although DACs 136 and 138 are illustrated as two separate devices, it is understood that a single digital-to-analog converter may be used that performs the function of DACs 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information on connection 140 and provides a modulated signal via connection 158 to upconverter 154. The upconverter 154 transforms the modulated signal on connection 158 to an appropriate transmit frequency and provides the upconverted signal to a power amplifier 180 via connection 184. The power amplifier 180 amplifies the signal to an appropriate power level for the system in which the portable transceiver 100 is designed to operate.

Details of the modulator 152 and the upconverter 154 have been omitted, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed. For example, when the power amplifier module is used in an application requiring both phase and amplitude modulation such as, for example, extended data rates for GSM evolution, referred to as EDGE, the cartesian in-phase (I) and quadrature (Q) components of the transmit signal are converted to their polar counterparts, amplitude and phase. The phase modulation is performed by the modulator 152, while the amplitude modulation is performed by the power amplifier control element 285, where the amplitude envelope is defined by a power control voltage $V_{PC}$, which is generated by the power amplifier control element 285. The instantaneous power level of the power amplifier module 180 tracks $V_{PC}$, thus generating a transmit signal with both phase and amplitude components. This technique, known as polar modulation, eliminates the need for linear amplification by the power amplifier module, allowing the use of a more efficient saturated mode of operation while providing both phase and amplitude modulation.

The power amplifier 180 supplies the amplified signal via connection 156 to a front end module 162. The front end module comprises an antenna system interface that may include, for example, a diplexer having a filter pair that allows simultaneous passage of both transmit signals and receive signals, as known to those having ordinary skill in the art. The transmit signal is supplied from the front end module 162 to the antenna 160. A portion of the output of the power amplifier 180 is supplied via connection 157 to the power amplifier control element 285. The operation of the power control element 285 will be described below.

Using the power control signal, $V_{PC}$, generated by the power amplifier control element 285, the power amplifier control element 285 determines the appropriate power level at which the power amplifier 180 operates to amplify the transmit signal. The power control signal, $V_{PC}$, is also used to provide envelope, or amplitude, modulation when required by the modulation standard. The power amplifier control element 285 also includes an embodiment of the amplitude calibration element 300. In one embodiment, the amplitude calibration element 300 is implemented as a digital state machine in the transmitter. However, the implementation of the amplitude calibration element 300 can be also distributed between the baseband subsystem 110 and the transmitter 150.

A signal received by antenna 160 will be directed from the front end module 162 to the receiver 170. The receiver 170 includes a downconverter 172, a filter 182, and a demodulator 178. If implemented using a direct conversion receiver (DCR), the downconverter 172 converts the received signal from an RF level to a baseband level. Alternatively, the received RF signal may be downconverted to an intermediate frequency (IF) signal, depending on the application. The downconverted signal is sent to the filter 182 via connection 174. The filter comprises a least one stage to filter the received downconverted signal as known in the art.

The filtered signal is sent from the filter 182 via connection 176 to the demodulator 178. The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 2:
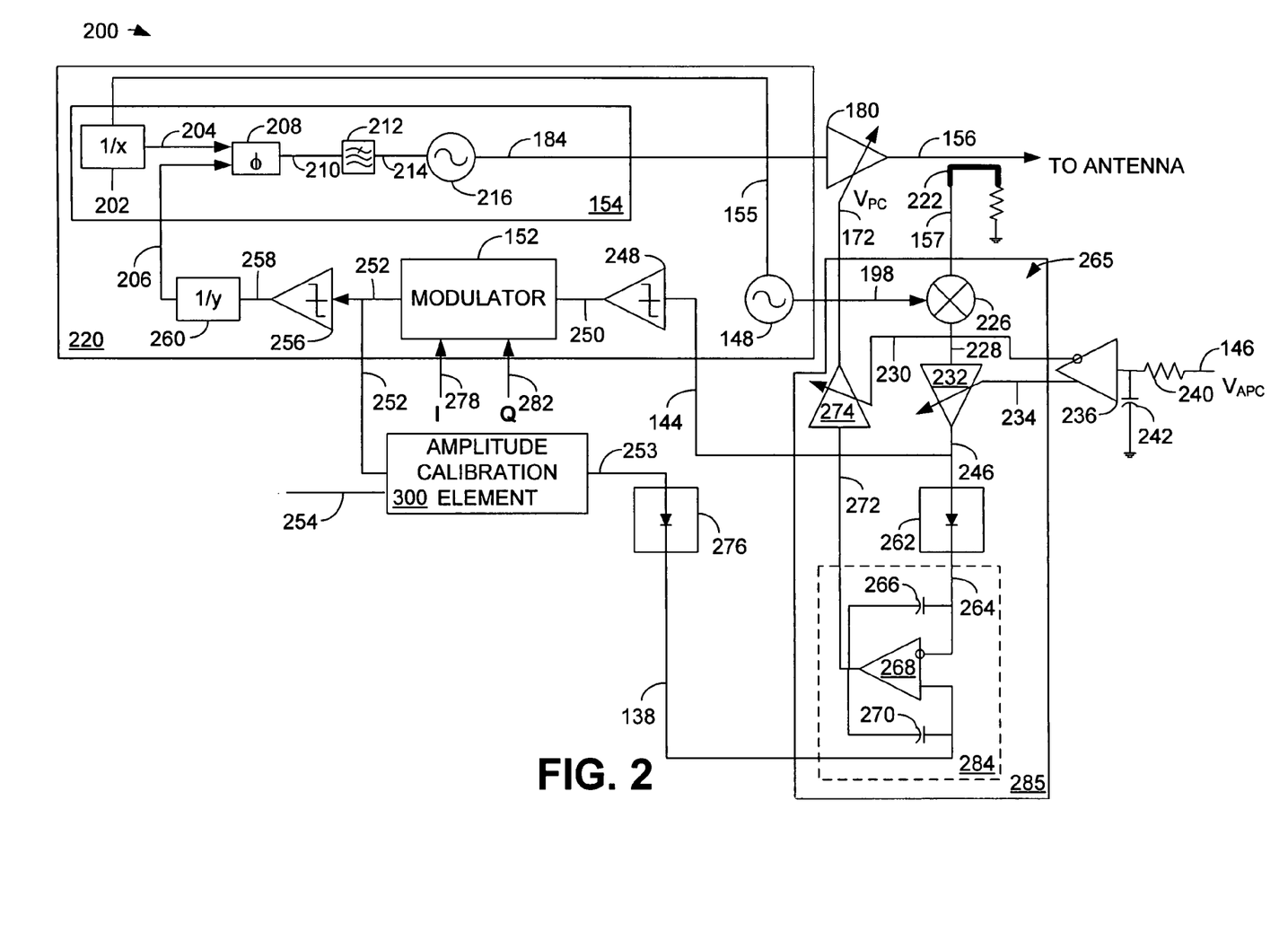
FIG. 2 is a block diagram illustrating a "polar loop" transmitter including the upconverter, power amplifier control element and the amplitude calibration element of FIG. 1.

FIG. 2 is a block diagram illustrating the upconverter 154, power amplifier control element 285 and the amplitude calibration element 300. Beginning with a description of the power amplifier control element 285, which forms a closed power control loop 265, or an "AM control loop," a portion of the output power present at the output of power amplifier 180 on connection 156 is diverted by coupler 222 via connection 157 and input to a mixer 226. The mixer 226 also receives a local oscillator (LO) signal from a synthesizer 148 via connection 198.

The mixer 226 downconverts the RF signal on connection 157 to an intermediate frequency (IF) signal on connection 228. For example, the mixer 226 takes a signal having a frequency of approximately 2 gigahertz (GHz) on connection 157 and down converts it to a frequency of approximately 100 megahertz (MHz) on connection 228 for input to variable gain element 232. The variable gain element 232 can be, for example but not limited to, a variable gain amplifier or an attenuator. In this embodiment, the variable gain element 232 is referred to as an "IF VGA." In such an arrangement, the variable gain element 232 might have a dynamic range of approximately 70 decibels (dB) i.e., +35 dB/−35 dB. The variable gain element 232 receives a control signal input from the non-inverting output of an amplifier 236 via connection 234. The input to amplifier 236 is supplied via connection 146 from the baseband subsystem 110 of FIG. 1. The signal on connection 146 is the power control signal, $V_{APC}$ which is a reference voltage signal that defines the transmit power level and provides the power profile. This signal on connection 146 is supplied to a reconstruction filter, which includes resistor 240 and capacitor 242. In this manner, a reference voltage for the transmit power level and power profile is supplied via connection 234 to the control input of the variable gain element 232.

The output of the variable gain element 232 on connection 246 is an IF signal and includes modulation having both an AM component and a PM component and is called a "power measurement signal." This power measurement signal is related to the absolute output power of power amplifier 180, and includes a very small error related to the AM and PM components present in the signal. The output of variable gain element 232 on connection 246 is supplied to the input of power detector 262 and is also supplied to a limiter 248. The IF signal on connection 246 includes both an AM component and a PM component. The signal on connection 246 is supplied to a power detector 262, which provides, on connection 264, a baseband signal representing the instantaneous level of IF power present on connection 246. The output of the power detector 262 on connection 264 is supplied to the inverting input of amplifier 268.

The amplifier 268, the capacitor 266 and the capacitor 270 form a comparator 284, which provides the error signal used to control the power amplifier 180 via connection 272. The non-inverting input to the amplifier 268 is supplied via connection 138 from the output of the modulator 152 through the amplitude calibration element 300 and the power detector 276. The power detector 276 is similar to the power detector 262. The signal on connection 138 is supplied to the non-inverting input of the amplifier 268 and contains the AM modulation developed by the modulator 152 and calibrated by the amplitude calibration element 300 for input to the control port 172 of the power amplifier 180.

The gain of the power amplifier control element 285 amplifies the signal on connection 272 such that the difference between the signals on connection 264 and on connection 138 input to amplifier 268 provide an error signal on connection 272 that is used to control the output of the power amplifier 180. The error signal on connection 272 is supplied to variable gain element 274, which can be similar in structure to the variable gain element 232. However, the variable gain element 274 has a function that is inverse to the function of the variable gain element 232. The control input to variable gain element 274 is supplied from the inverting output of amplifier 236. In this manner, the power amplifier control signal on connection 172 supplied to the control port of the power amplifier 180 drives the power amplifier 180 to provide the proper output on connection 156. The variable gain amplifier 274 is also referred to as a "baseband VGA."

The level of the signal on connection 264 and the level of the signal on connection 138 should be equal. For example, if the output level of the variable gain element 232 is increased by a factor of 10, then the level of the output of power amplifier 180 should be decreased accordingly, to maintain equilibrium at the input of the amplifier 268. The output of the power amplifier 180 changes to cancel the gain change of variable gain element 232. In this manner, the amplitude of the signal on connection 264 remains equal to the amplitude of the signal on connection 138. However, this implies that the signal on connection 228 lags the signal on connection 234 with the result that the two signals will not completely cancel. In this manner, an error signal with an AM portion and a PM portion is present on connection 246. The signal on connection 246 is converted by power detector 262 from an IF signal to a baseband signal on connection 264. The signal on connection 264 is amplified by amplifier 268 and amplifier 274 and provided as a control input to the power amplifier 180 on connection 172. The power amplifier control element 285 has sufficient gain so that the error signal on connection 264 can be kept small. In such a case, the gain changes of variable gain element 232 and the power amplifier 180 will substantially be the inverse of each other.

In addition to amplifying the error signal on connection 264, the amplifier 268 also compares the power measurement signal on connection 264 with a reference voltage signal including an AM portion on connection 138, supplied by the modulator 152 and the amplitude calibration element 300. The DC voltage level on connection 138 affects the desired static output power for the amplifier 268, irrespective of AM modulation. The amplifier 268 compares the signal level on connection 264 with the signal level on connection 138 and then amplifies the difference, thus providing a power control signal on connection 272. The comparator 284 functions also as an integrator, which is also a low pass filter. Alternatively, the AM portion of the signal may be introduced to the power amplifier control element 285 in other ways, such as, for example, through the variable gain element 232.

The power control signal on connection 272 drives the variable gain amplifier 274, which corrects for the effect that the variable gain element 232 has on the transfer function of the power amplifier control element 285. The variable gains of the variable gain element 232 and variable gain element 274 are complimentary. Because the power measurement signal is present on connection 264 and the AM error signal is present on connection 138, the amplifier 268 provides a dual function; (1) it amplifies the AM error signal on connection 138 so as to modulate the power output of power amplifier 180 via connection 172 to have the correct amount of AM; and (2) it performs the average power comparison and amplifies the result, thus providing a control signal on connection 272 that drives the variable gain amplifier 274. The variable gain amplifier 274 provides a voltage signal, $V_{PC}$, on connection 172, which includes the AM portion and which drives the power amplifier 180. The amplifier control element 285 drives the power amplifier 180 to the correct average power output level. In this manner, power output is controlled and the desired AM portion of the signal is supplied to the control input 172 of power amplifier 180 and made present on the power amplifier output on connection 156. The mixer 226, variable gain element 232, power detector 262, amplifier 268 and the variable gain element 274 provide a continuous closed power control loop 265 to control the power output of power amplifier 180, while allowing for the introduction of the AM portion of the transmit signal via connection 138.

At all times, the closed power control loop 265 allows the correction of any phase shift caused by power amplifier 180. The phase locked loop 220 now includes a closed power control feedback loop for looping back the output of power amplifier 180 to the input of phase/frequency detector 208. Any unwanted phase shift generated by the power amplifier 180 will be corrected by the phase locked loop 220. The output of variable gain element 232 passes any phase distortion present via connection 246 and 144 to limiter 248 for correction by the phase locked loop 220. As such, the phase of the output of power amplifier 180 is forced to follow the phase of the LO signal on connection 155.

To remove the AM from the output of variable gain element 232, the variable gain element 232 is connected via connection 246 and connection 144 to the input of limiter 248. Limiter 248 develops a local oscillator signal containing only a PM component on connection 250. This LO signal is supplied via connection 250 to the modulator 152. In addition, the baseband I and Q information signals are supplied via connections 278 and 282, respectively, to the modulator 152. The I and Q baseband information signal interface is understood by those having ordinary skill in the art. As a result of the operation of the modulator 152, the output on connection 252 is an intermediate frequency signal including an AM component in the form of an AM reference signal and a small PM error signal. The output of modulator 152 is supplied via connection 252 to the amplitude calibration element 300, which operates at a frequency of, in this example, 100 MHz. The amplitude calibration element 300 precisely detects the level of AM present on connection 252 and provides a calibrated AM reference signal on connection 253 to the power detector 276. The architecture and operation of the amplitude calibration element 300 will be described in detail below. In this manner, the output of power detector 276 also includes the AM portion of the desired transmit signal. In this manner, the signal provided on connection 138 is a reference signal for input to the power control loop 265. Because the power control loop 265 has limited bandwidth, the rate at which the amplitude modulation occurs on connection 138 is preferably within that power control loop bandwidth.

The LO signal output by the modulator 152 is supplied via connection 252 to a second limiter 256. The output of the second limiter 256 is supplied via connection 258 to a divider 260, which divides the signal on connection 258 by a number, "y." The number "y" is chosen so as to minimize the design complexity of the synthesizer 148. The output of the divider 260 is supplied to the phase/frequency detector 208.

An unmodulated input signal from synthesizer 148 is supplied to the divider 202 via connection 155. The unmodulated input signal is frequency divided by a number "x" to provide a signal having an appropriate frequency on connection 204. The number "x" is chosen to minimize the design complexity of the synthesizer 148 and can be, for example, but not limited to, chosen to convert the output of the synthesizer 148 to a frequency of 100 MHz. The output of the divider on connection 204 is supplied to the phase/frequency detector 208. The baseband I and Q information signals are supplied via connections 278 and 282, respectively, to the modulator 152. The I and Q baseband information signal interface is understood by those having ordinary skill in the art. As a result of the operation of the modulator 152, the output on connection 252 is an intermediate frequency signal including an AM component in the form of an AM reference signal and a small PM error signal. The output of modulator 152 is supplied via connection 252 through the amplitude calibration element 300 to the power detector 276. The output of power detector 276 also includes the AM portion of the desired transmit signal. The signal provided on connection 138 is a reference signal for input to the power amplifier control element 285. Because the power amplifier control element 285 has limited bandwidth, the rate at which the amplitude modulation occurs on connection 138 is preferably within the bandwidth of the power control feedback loop 265.

The output of limiter 248 is supplied via connection 250 as a local oscillator signal having a PM component, but substantially no AM component to the modulator 152. The modulator 152 removes virtually the entire PM component and applies an AM modulated component to the signal and supplies this signal via connection 252. In order to remove the PM component present on connection 250, the I and Q signals are reversed on connections 278 and 282, respectively. In this manner, the output of modulator 152 on connection 252 contains a very small PM portion and a significant AM portion. With respect to the PM component of the signal on connection 252, the modulator 152 acts as a comparator, comparing the I and Q signals on connections 278 and 282, respectively, with the LO signal supplied from the output of the variable gain element 232, through limiter 248 and on connection 250. The components within the phase locked loop 220 provide gain for the comparison of the PM on connection 250 and the modulator connections 278 and 282, thus providing a phase error output of the modulator 152 on connection 252. This phase error signal is then supplied to limiter 256, which outputs a signal on connection 258 containing the small PM phase error component. In this manner, a feedback signal taken from the output of variable gain element 232 on connection 246 is supplied as continuous feedback to the phase locked loop 220.

The error signal output of modulator 152 on connection 252 containing the phase error will get smaller and smaller as the gain of the phase locked loop 220 increases. However, there will always be some error signal present, thus enabling the phase locked loop 220 to achieve phase lock. It should be noted that even when the power amplifier 180 is not operating, there will always be some small leakage through the power amplifier 180 onto connection 156. This small leakage is sufficient to provide a feedback signal through the variable gain element 232 and into the phase locked loop 220 such that the phase locked loop 220 can be locked using just the leakage output of power amplifier 180. In this manner, a single feedback loop can be used to continuously control the output power of power amplifier 180 from the time that the amplifier is off through the time when the amplifier 180 is providing full output power.

The phase/frequency detector 208 receives an unmodulated input signal from synthesizer 148 via connection 155, divider 202 and connection 204. The unmodulated input signal is frequency divided by a number "x" in order to provide a signal having an appropriate frequency on connection 204. The number "x" is chosen so as to minimize the design complexity of the synthesizer 148 and can be, for example, but not limited to, chosen to convert the output of the synthesizer 148 to a frequency of 100 MHz. The phase/frequency detector 208 also receives the output of divider 260 via connection 206. The number "y" is chosen in similar manner to that of the number "x." The phase/frequency detector 208 detects any phase difference between the signal on connection 204 and the signal on connection 206 and places a signal on connection 210 that has an amplitude proportional to the difference. When the phase difference reaches 360°, the output of phase/frequency detector 208 on connection 210 will become proportional to the frequency difference between the signals on connections 204 and 206.

The output of phase/frequency detector 208 on connection 210 is a digital signal having a value of either a 0 or a 1 with a very small transition time between the two output states. This signal on connection 210 is supplied to low-pass filter 212, which integrates the signal on connection 210 and places a DC signal on connection 214 that controls the frequency of the transmit voltage control oscillator (TX VCO) 216. The output of TX VCO 216 is supplied via connection 184 directly to the power amplifier 180. In this manner, the synthesizer 148, limiter 248, modulator 152, limiter 256, divider 260, divider 202, phase/frequency detector 208, low-pass filter 212 and TX VCO 216 form a phase locked loop (PLL) 220, which is used to determine the transmit frequency on connection 184. When the PLL 220 is settled, or "locked," then the two signals entering the phase/frequency detector 208 on connections 204 and 206 have precisely the same phase and frequency, and the output of the phase/frequency detector 208 on connection 210 goes to zero. The output of the integrating low-pass filter 212 on connection 214 stabilizes, resulting in a fixed frequency out of TX VCO 216. For example, the synthesizer 148 and the mixer 226 ensure that the frequency of the signal output from the TX VCO 216 on connection 184 tracks the sum of the frequencies of the local oscillator signal supplied by synthesizer 148 and the IF frequency on connection 206.

When the phase locked loop 220 is locked, the phase of the signal on connection 204 and the phase of the signal on connection 206 will be equal. Because the amount of PM on connection 206 should be very small, the gain in the phase locked loop 220 has to be sufficiently high to amplify the error signal on connection 206 to a level at which the phase/frequency detector 208 can make a comparison. By using the modulator 152 to impose the I and Q information signals on the signal on connection 250 in a direction opposite from which it is desirable for the phase of the TX VCO 216 to move, and because it is desirable for the phase locked loop 220 to remain locked, the phase of the signal output from the TX VCO 216 on connection 184 will move opposite that of the phase imposed by the modulator 152. In this manner, the PM error signal present on connection 206 is minimized by the very high sensitivity, of the order of many MHz per volt, of the TX VCO 216.

Because the power control element 285 forms a closed loop for AM signals at connection 138, it is possible to use a non-linear, and therefore highly efficient, power amplifier 180. Furthermore, the undesirable and detrimental AM-to-PM conversion, which occurs due to the amplitude dependence of an amplifier's phase shift, is rectified by the power amplifier 180 being included within the phase locked loop 220. By separating the AM and the PM modulation and by providing closed loop control for both the AM and PM modulation, a non-linear, and therefore highly efficient power amplifier can be used. The amplitude calibration element 300, which will be described in detail below, detects and calibrates the AM portion of the signal and controls the output of the power amplifier 180.

Figure 3:
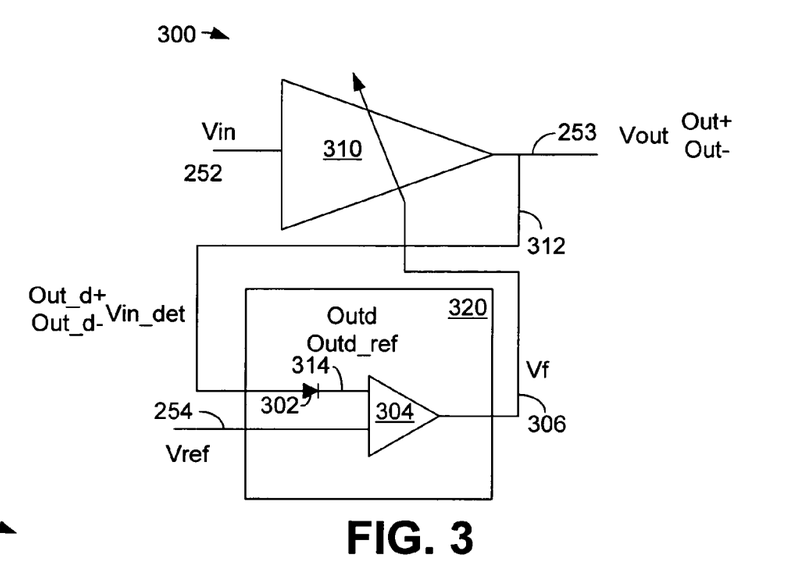
FIG. 3 is a schematic diagram illustrating the amplitude calibration element of FIG. 2.

FIG. 3 is a schematic diagram illustrating the amplitude calibration element 300 of FIG. 2. The amplitude calibration element 300 includes a linear driver 310 and a detector and calibration circuit 320. The detector and calibration circuit 320 comprises a differential detector 302 and a differential comparator 304. The linear driver 310 operates with fixed gain settings while the detector and calibration circuit 320 sets the gain of the linear driver 310 based on a voltage reference signal supplied to connection 254 and the output of the differential detector 302 on connection 314. The output of the linear driver 310 on connection 253 is supplied to the detector 276 of FIG. 2. A level shifted version of the signal on connection 253 is also supplied via connection 312 to the differential detector 302. The output of the differential comparator 304 on connection 306 is supplied as the gain input signal, also referred to as a control signal, to the linear driver 310. While the output of the linear driver 310 on connection 253 is referred to as Vout and differentially as Out+ and Out−, the signal supplied on connection 312 to the differential detector 302 is referred to as Vin_det, or differentially as Out_d+ and Out_d−.

The amplitude calibration element 300 receives the output of the modulator 152 (FIG. 2) on connection 252 as a voltage input Vin, and provides on connection 253 a calibrated AM signal, which is supplied as the AM input signal to the power amplifier control element 285.

Figure 4:
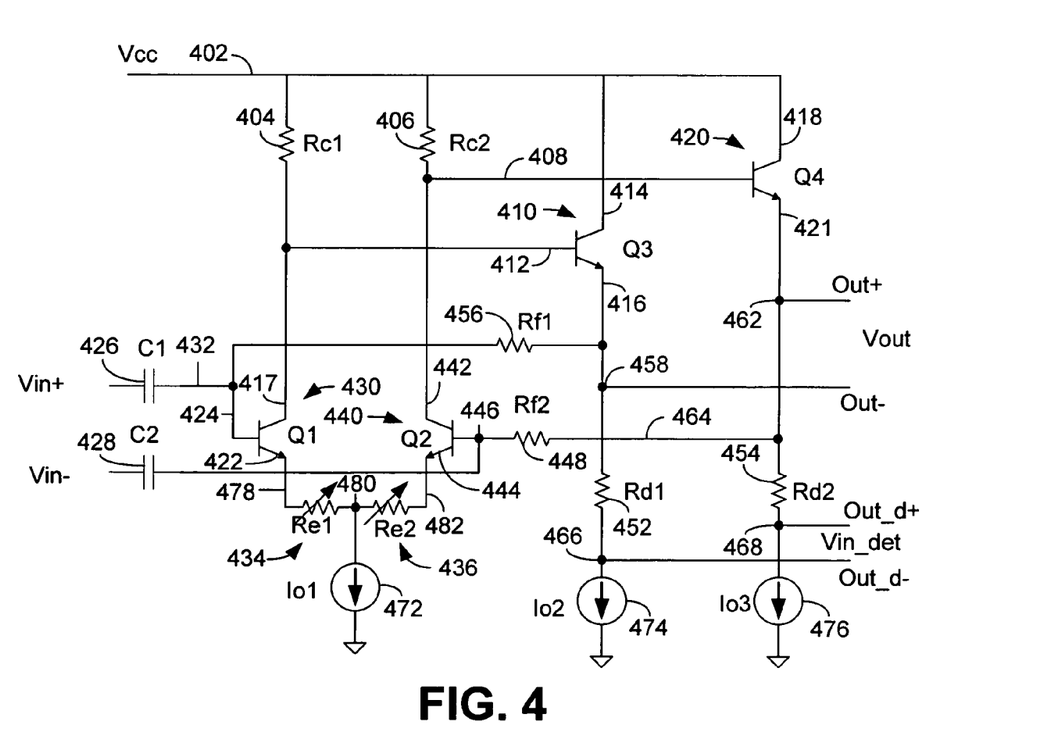
FIG. 4 is a schematic diagram illustrating an embodiment of the linear driver of FIG. 3.

FIG. 4 is a schematic diagram 400 illustrating an embodiment of the linear driver 310 of FIG. 3. A voltage source Vcc supplies a voltage supply via connection 402. Differential voltage input signals Vin+ and Vin−, which correspond to the signal Vin in FIG. 3 are supplied to capacitors 426 and 428, respectively. The transistors 430 and 440 form a differential pair having their emitter terminals 422 and 444, respectively, coupled to adjustable resistances 434 and 436, respectively. As will be described below, the values of adjustable resistances 434 and 436 are controlled by logic in the detector and calibration circuit 320 to control the gain applied to the linear driver 310. The terminal 480 between the adjustable resistances 434 and 436 is coupled to a current source 472. The collector terminal 417 of the transistor 430 is coupled to resistor 404 and the collector terminal 442 of resistor 440 is coupled to resistor 406. The base of transistor 430 is coupled via connection 424 to capacitor 426 and through resistance 456 to node 458, which is coupled to the emitter 416 of transistor 410. The base 446 of transistor 440 is coupled through resistor 448 to the emitter 421 of transistor 420 and to resistance 454. The base terminal 446 of transistor 440 is also coupled to capacitor 428. The collector 414 of transistor 410 is coupled to connection 402 while the collector 418 of transistor 420 is also coupled to connection 402. The differential output signals Out+ and Out−, correspond to the signal Vout in FIG. 3 and are taken from connections 462 and 458. These are the system outputs that are supplied to the detector 276 of FIG. 2.

The level of this output is also shifted by resistors 452 and 454 so that the differential outputs Out_d+ and Out_d− on connections 468 and 466, respectively, are supplied as the Vin_det signal via connection 312 to the differential detector 302 in FIG. 3. The resistor 452 is coupled to a current source 474 and the resistor 454 is coupled to a current source 476. The transistors in FIG. 4 are shown as bipolar junction transistors for illustrative purposes only. Other transistor technologies may be implemented.

Figure 5:
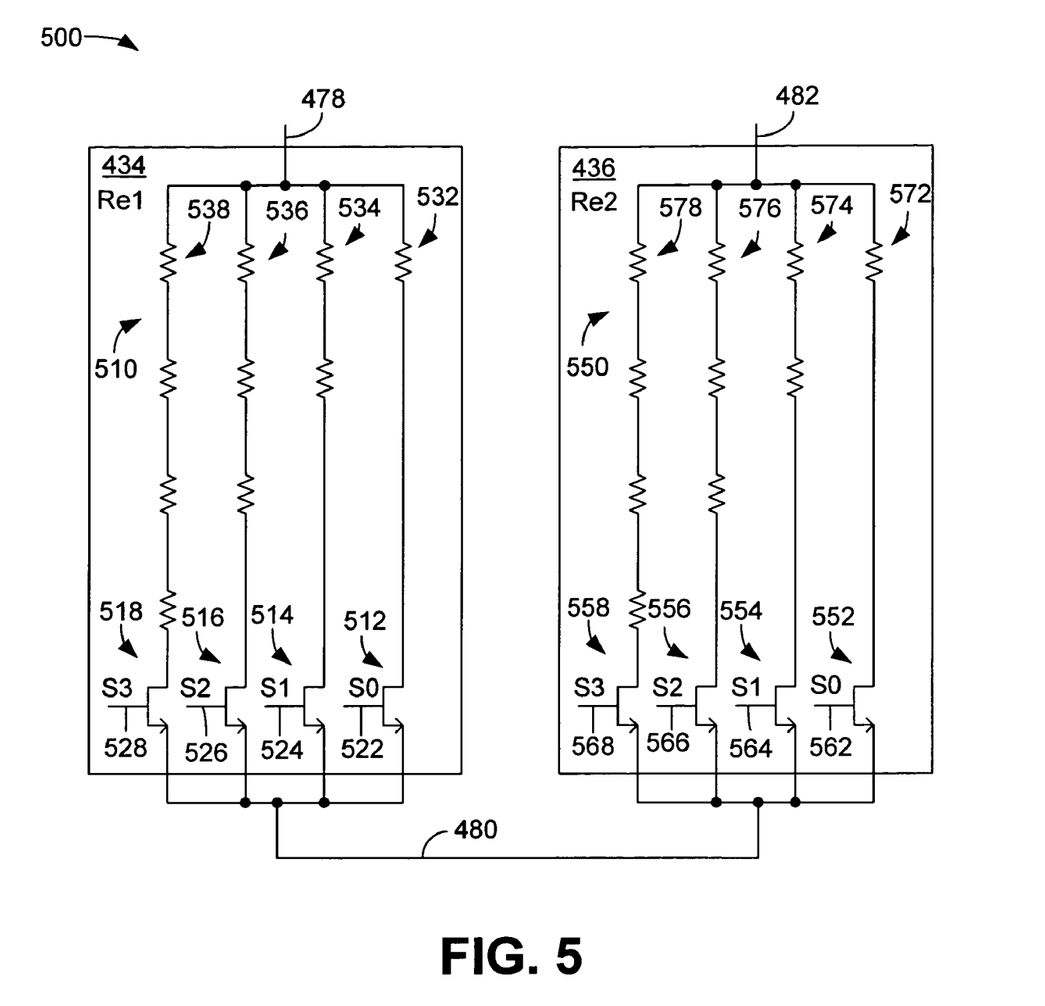
FIG. 5 is a schematic diagram illustrating the adjustable resistances of FIG. 4.

FIG. 5 is a schematic diagram 500 illustrating the adjustable resistances 434 and 436 of FIG. 4. The adjustable resistances 434 and 436 are controlled by electronic switches that form resistive gain switches to control the output of the linear driver 310 of FIG. 3.

The adjustable resistance 434 includes, in this example, four groups of series connected resistances of different values, collectively illustrated as 510. The resistances are binary weighted and arranged in a ladder configuration. The four groups of resistances are illustrated at 532, 534, 536 and 538. The resistances in each group 532, 534, 536 and 538 are connected serially to switches 512, 514, 516 and 518, respectively. The switches 512, 514, 516 and 518 can be implemented as, for example, field effect transistor (FET) switches as shown, or using any other digital logic controlled switch technology. The switch 512 includes a gate 522 to receive the input signal S0, the switch 514 includes a gate 524 configured to receive the control signal S1, the switch 516 includes a gate 526 configured to receive the control signal S2 and the switch 518 includes a gate 528 configured to receive the control signal S3. The control signals S0, S1, S2 and s3 are digital logic level signals that are provided by the detector and calibration circuit 320.

The adjustable resistance 436 includes, in this example, four groups of series connected resistances of different values, collectively illustrated at 550. The resistances are binary weighted and arranged in a ladder configuration. The four groups of resistances are illustrated at 572, 574, 576 and 578. The resistances in each group 572, 574, 576 and 578 are connected serially to switches 552, 554, 556 and 558, respectively. The switches 552, 554, 556 and 558 can be implemented as, for example, field effect transistor (FET) switches as shown, or using any other digital logic controlled switch technology. The switch 552 includes a gate 562 to receive the input signal S0, the switch 554 includes a gate 564 configured to receive the control signal S1, the switch 556 includes a gate 566 configured to receive the control signal S2 and the switch 558 includes a gate 568 configured to receive the control signal S3. The control signals S0, S1, S2 and s3 are digital logic level signals that are provided by the detector and calibration circuit 320.

The variable resistances 434 and 436 are coupled to connection 480 (see FIG. 4), while the variable resistance 434 is also coupled via connection 478 to the emitter 422 of transistor 430 (FIG. 4) and the variable resistance 436 is also coupled via connection 482 to the emitter 444 of transistor 440 (FIG. 4).

Figure 6:
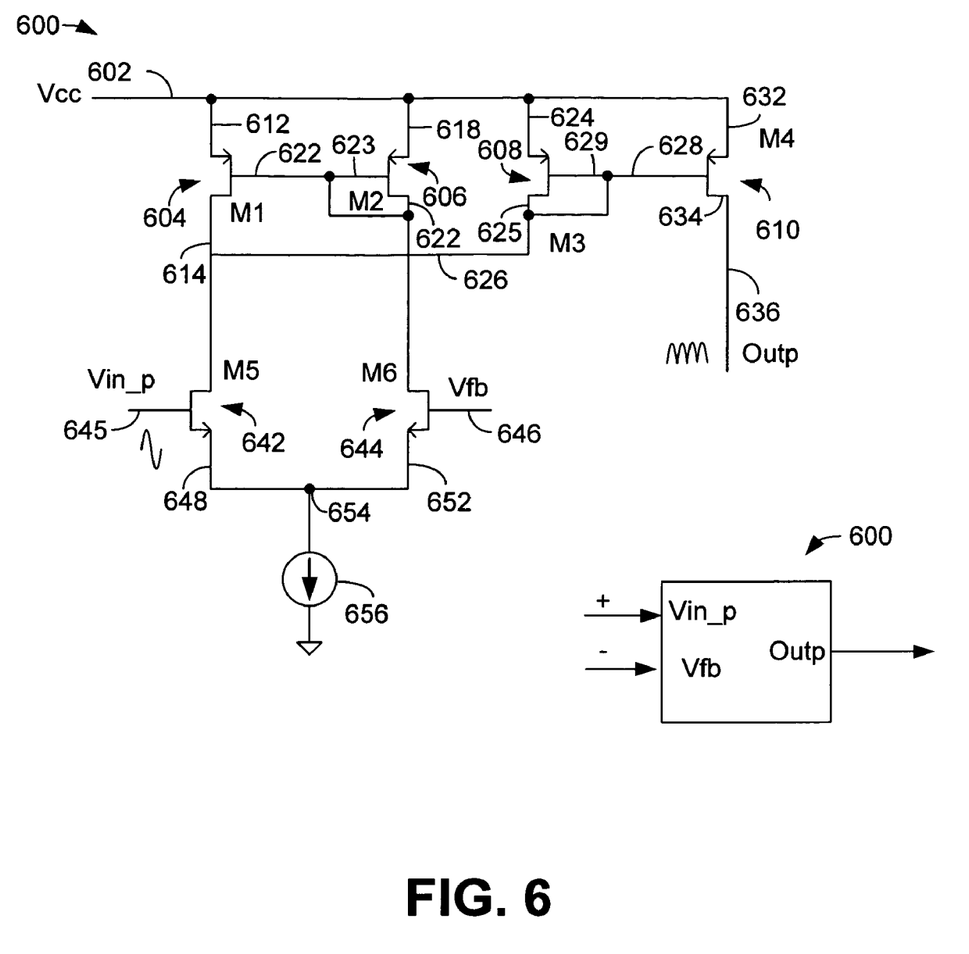
FIG. 6 is a schematic diagram illustrating a basic detector pump circuit used in the detector and calibration circuit of FIG. 3.
Figure 7:
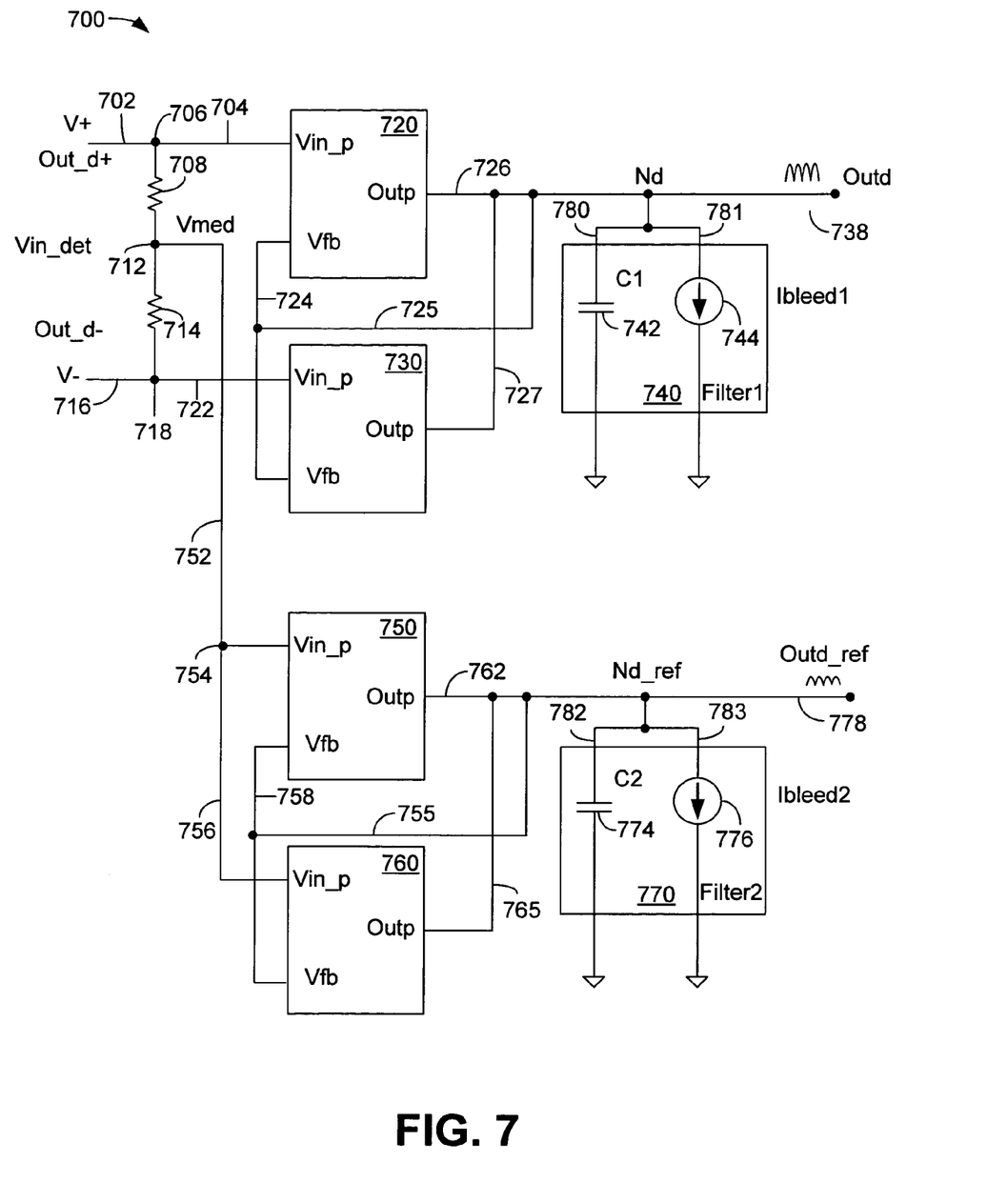
FIG. 7 is a schematic diagram illustrating a differential detector formed using a number of detector pump circuits of FIG. 6.

FIG. 6 is a schematic diagram 600 illustrating one of a number of basic detector pump circuits used in the detector and calibration circuit 320 of FIG. 3. The detector pump circuit 600 includes a voltage source Vcc supplying a system voltage on connection 602 to transistors 604, 606, 608 and 610. The source 612 of transistor 604, the source 618 of transistor 606, the source 624 of transistor 608 and the source 632 of transistor 610 are all connected to Vcc on connection 602. The gate 622 of transistor 604 is coupled to the gate 623 of transistor 606, which are also coupled to the drain 622 of transistor 606. Similarly, the gate 628 of transistor 610 is coupled to the gate 629 of transistor 608, which are also coupled to the drain 625 of transistor 608. The drain 625 of transistor 608 is also coupled to the drains 622 and 614 of transistors 606 and 604, respectively. A voltage signal input Vin_p is supplied to the gate terminal 645 of transistor 642. A voltage feedback signal Vfb is supplied to the gate terminal 646 of transistor 644. The generation of the signals Vin_p and Vfb is shown in FIG. 7. The sources 648 and 652 of transistors 642 and 644, respectively, are coupled to node 654. The node 654 is coupled to a current source 656. The output of the detector pump circuit 600 is a pulsed current and is supplied on connection 636. The signal on connection 636 is referred to as the signal Outp. The detector pump circuit 600 is shown in block diagram format also for simplicity, as will be described below.

FIG. 7 is a schematic diagram 700 illustrating a differential detector formed using a number of detector pump circuits of FIG. 6. The detector pump circuits 720 and 730 form one circuit element for detecting the positive and negative phase of the input signal while the detector pump circuits 750 and 760 detect the middle point Vmed of the input signal. The detection for the middle point is used as a reference for the differential detector. A positive portion Out_d+ of a differential input signal from the linear driver 310 is supplied on connection 702 while the negative portion Out_d− of a differential input signal from the linear driver 310 is supplied via connection 716. The differential signals on connections 702 and 716 correspond to the Vin_det signal shown in FIG. 3, which are also the Out_d+ and Out_d− differential signals shown in FIG. 4. The median value for the input signal V_med is taken at node 712 between resistances 708 and 714, and supplied to the detector pump circuits 750 and 760. The Out_d+ signal is supplied as the signal Vin_p to detector pump circuit 720 via connection 704 while the Out_d− signal is supplied as the Vin_p signal to the detector pump circuit 730 via connection 722. The median value of the Vin_det signal is supplied as the signal Vin_p to the detector pump circuit 750 via connection 754 and supplied to the detector pump circuit 760 via connection 756.

The output current Outp of detector pump circuit 720 is added on connection 726 with the output current Outp of detector pump circuit 730 on connection 727. The sum supplies the filter 740 and generates a voltage on node Nd. The filter 740 includes a capacitor 742 and a current source 744 that is designed to draw a very small amount of current also referred to as a "bleed" current. The capacitor 742 is connected through connection 780 and 781 with the bleed current Ibleed1 to form a filter. The voltage on node Nd is fed back via connection 725 to the feedback input Vfb of detector pump circuits 720 and 730. The voltage on node Nd also appears at the output Outd on connection 738. Similarly the output current Outp of detector pump circuit 750 is added on connection 762 with the output current Outp of detector pump circuit 760 on connection 765. The sum supplies the filter 770 and generates a voltage on node Nd_ref. The filter 770 includes a capacitor 774 and a current source 776 that is designed to draw a very small amount of current also referred to as a "bleed" current. The capacitor 774 is connected through connection 782 and 783 with the bleed current Ibleed2 to form a filter. The voltage on node Nd_ref is fed back via connection 755 to the feedback input Vfb of detector pump circuits 750 and 760. The voltage on node Nd_ref also appears at the output Outd_ref on connection 778. The differential signals Outd and Outd_ref are supplied as one of differential inputs 314 of the differential comparator 304 (FIG. 3).

Figure 8:
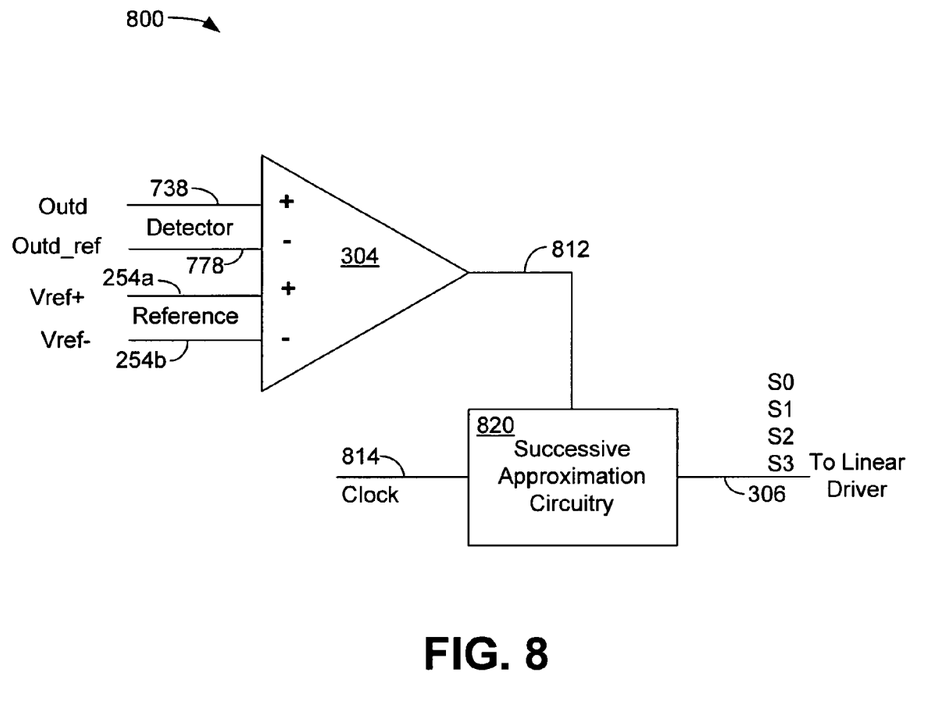
FIG. 8 is a schematic diagram illustrating an embodiment of successive approximation circuitry used by the detector and calibration circuit of FIG. 3.

FIG. 8 is a schematic diagram 800 illustrating an embodiment of successive approximation circuitry used by the detector and calibration circuit 320 of FIG. 3. The successive approximation circuitry 800 includes the differential detector 304 of FIG. 3. The inputs to the differential detector 304 shown in FIG. 8 are shown as differential inputs. The differential detector outputs Outd and Outd_ref are supplied via connections 738 and 778, respectively, to the differential comparator 304. Differential voltage reference signals are supplied via connections 254a and 254b to the differential comparator 304. The output of the differential comparator 304 is supplied via connection 812 to successive approximation circuitry 820. The successive approximation circuitry 820 receives a clock input signal on connection 814 and provides as output on connection 306 control signals S0, S1, S2 and S3 that control the variable resistances 434 and 436 within the linear driver 310. In this example, the amplitude calibration element 300 operates at a frequency of approximately 100 Mhz, while the power control loop 285 operates at approximately 1.8 MHz. Generally, the operation of the successive approximation circuit is as follows. The linear driver 310 (FIG. 3) is set to a middle gain position. The output of the linear driver 310 is detected in the detector and calibration circuit 320 (FIG. 3) and compared with the reference signal Vref (254 of FIG. 3). If the comparison is higher in the next step the gain of the linear driver 310 is reduced in half. The detector and calibration circuit 320 detects the new value and the process continues. This technique is known in the art.

Figure 9:
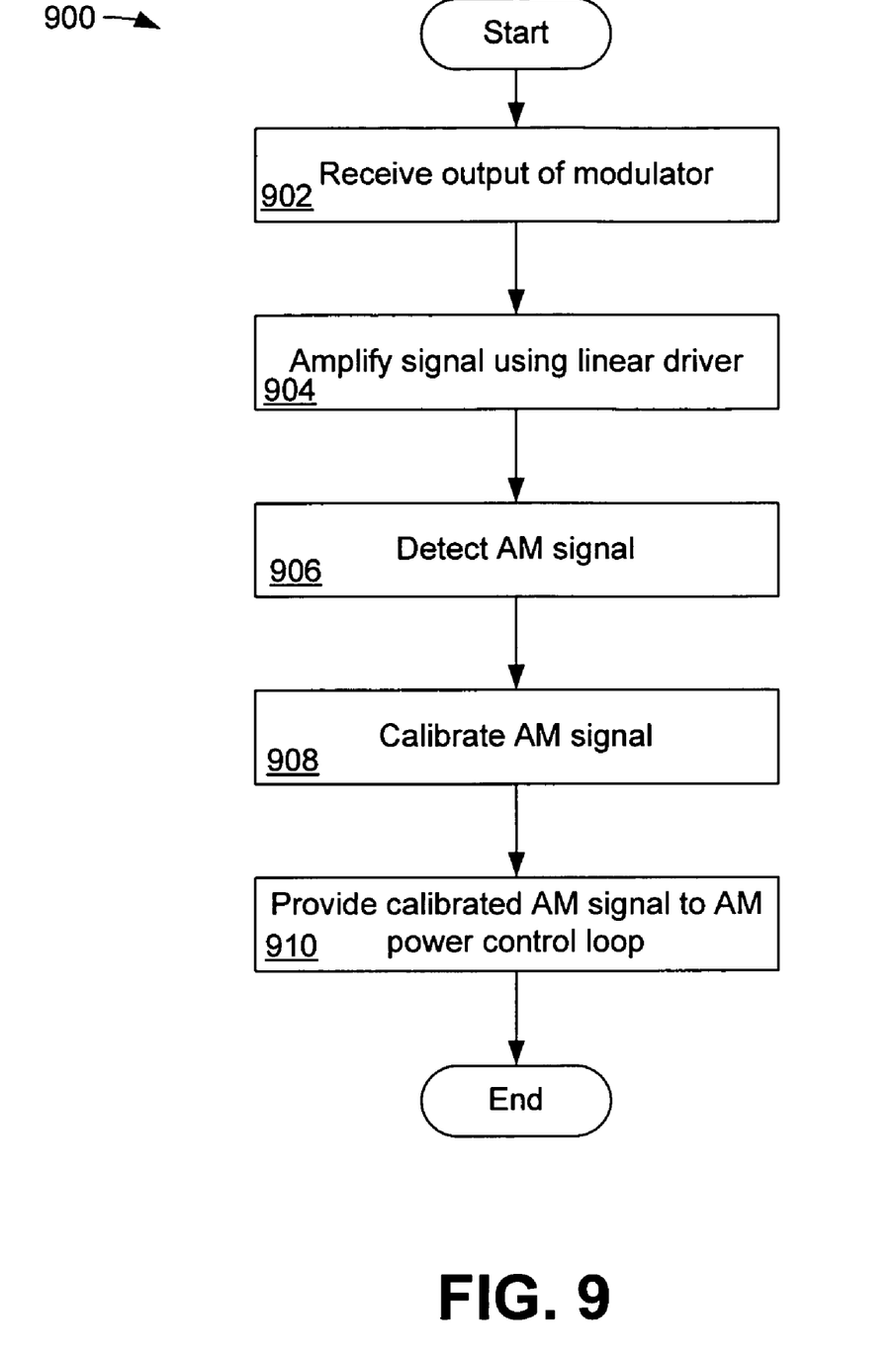
FIG. 9 is a flow chart describing the operation of one embodiment of the invention.

FIG. 9 is a flow chart 900 describing the operation of one embodiment of the invention. The blocks in the flow chart may be performed in the order shown, out of the order shown, or may be performed in parallel. In block 902, the amplitude calibration element 300 receives the output of the modulator 152 of FIG. 2. In block 904, the output of the modulator on connection 252 and the voltage reference signal on connection 254 are processed by the amplitude calibration element 300. In block 906, the AM portion of the signal on connection 252 is detected, and in block 908, the signal is calibrated so that it may be supplied to the closed power control loop 285. In block 910, a calibrated AM signal is provided to the power control loop 285.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. An amplitude calibration element, comprising:
   a linear driver having adjustable resistances capable of being controlled by a digital logic signal, the linear driver configured to receive the output of a modulator, the modulator output comprising a voltage signal having an amplitude modulated (AM) portion;
   a differential detector having a current source and logic configured to detect two phases of the AM portion, filter the AM portion, receive an output of the linear driver and develop a differential signal corresponding to the AM portion; and
   a differential comparator configured to receive the output of the differential detector and a differential reference signal, the differential comparator having a successive approximation circuit that develops the digital logic signal for controlling the adjustable resistances and configured to develop a gain control signal to control the gain of the linear driver.

2. The amplitude calibration element of claim 1, wherein the linear driver, differential detector and differential comparator operate at a frequency of approximately 100 MHz.

3. The amplitude calibration element of claim 1, wherein the adjustable resistances are binary weighted and arranged in a ladder configuration.

4. The amplitude calibration element of claim 1, wherein the differential detector further comprises a plurality of detector pump circuits, each detector pump circuit configured to generate a pulsed current.

5. The amplitude calibration element of claim 4, wherein a first plurality of detector pump circuits form one circuit element configured to detect positive and negative phase of an input signal, and a second plurality of detector pump circuits form another circuit element configured to detect a middle point of the input signal.

6. The amplitude calibration element of claim 5, wherein the detection of the middle point of the input signal is used as a reference for the differential detector.

7. A method for detecting and calibrating an amplitude modulated portion of an amplitude and phase modulated transmit signal, comprising:
   generating a power control signal in a closed power control loop by digitally controlling the resistance of a plurality of adjustable resistances associated with a linear driver to control the gain of the linear driver, wherein digitally controlling comprises using a successive approximation circuit to develop a digital logic signal capable of controlling the adjustable resistances;

generating an amplitude modulated (AM) signal and a phase modulated (PM) signal;

detecting two phases of the AM signal using a differential detector;

developing a current corresponding to the level of the AM signal for each phase of the AM signal;

filtering each phase of the AM signal;

adjusting the current of each phase of the AM signal using a current source associated with each phase;

comparing the adjusted current with a reference signal in a differential comparator to develop a digital control signal to control the adjustable resistances; and differentially detecting and calibrating the amplitude modulated signal at a bandwidth higher than the bandwidth of the power control loop.

8. The method of claim 7, further comprising operating the linear driver, differential detector and differential comparator at a frequency of approximately 100 MHz.

9. The method of claim 8, further comprising:
binary weighting the adjustable resistances; and
arranging the adjustable resistances in a ladder configuration.

10. The method of claim 7, further comprising using a differential detector to generate a pulsed current.

11. The method of claim 10, further comprising detecting positive and negative phase of an input signal, and detecting a middle point of the input signal.

12. The method of claim 11, further comprising using the detected middle point of the input signal as a reference for the differential detector.

13. A portable transceiver, comprising:
a transceiver for transmitting and receiving a radio frequency (RF) signal;

a linear driver having adjustable resistances capable of being controlled by a digital logic signal, the linear driver configured to receive the output of a modulator, the modulator output comprising a voltage signal having an amplitude modulated (AM) portion;

a differential detector having a current source and logic configured to detect two phases of the AM portion, filter the AM portion, receive an output of the linear driver and develop a differential signal corresponding to the AM portion; and a differential comparator configured to receive the output of the differential detector and a differential reference signal, the differential comparator having a successive approximation circuit that develops the digital logic signal for controlling the adjustable resistances and configured to develop a gain control signal to control the gain of the linear driver.

14. The portable transceiver of claim 13, wherein the linear driver, differential detector and differential comparator operate at a frequency of approximately 100 MHz.

15. The portable transceiver of claim 14, wherein the adjustable resistances are binary weighted and arranged in a ladder configuration.

16. The portable transceiver of claim 13, wherein the differential detector further comprises a plurality of detector pump circuits, each detector pump circuit configured to generate a pulsed current.

17. The portable transceiver of claim 16, wherein a first plurality of detector pump circuits form one circuit element configured to detect positive and negative phase of an input signal, and a second plurality of detector pump circuits form another circuit element configured to detect a middle point of the input signal.

18. The portable transceiver of claim 17, wherein the detection of the middle point of the input signal is used as a reference for the differential detector.

* * * * *